US008981470B2

(12) United States Patent
Nozu

(10) Patent No.: US 8,981,470 B2
(45) Date of Patent: Mar. 17, 2015

(54) SEMICONDUCTOR DEVICE AND MANUFACTURING METHOD OF THE SAME

(71) Applicant: Kabushiki Kaisha Toshiba, Tokyo (JP)

(72) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/787,628

(22) Filed: Mar. 6, 2013

(65) Prior Publication Data
US 2014/0077278 A1   Mar. 20, 2014

(30) Foreign Application Priority Data
Sep. 18, 2012 (JP) ................. 2012-205047

(51) Int. Cl.
| H01L 29/78 | (2006.01) |
| H01L 23/48 | (2006.01) |
| H01L 29/66 | (2006.01) |
| H01L 29/40 | (2006.01) |
| H01L 29/08 | (2006.01) |
| H01L 29/10 | (2006.01) |

(52) U.S. Cl.
CPC .............. *H01L 29/78* (2013.01); *H01L 23/48* (2013.01); *H01L 29/66477* (2013.01); *H01L 29/407* (2013.01); *H01L 29/66734* (2013.01); *H01L 29/7813* (2013.01); *H01L 29/0865* (2013.01); *H01L 29/1095* (2013.01); *H01L 2924/0002* (2013.01)
USPC .......................................... 257/331; 438/270

(58) Field of Classification Search
CPC .............. H01L 29/402; H01L 29/404; H01L 29/66712; H01L 29/7813; H01L 29/407; H01L 29/1095; H01L 29/78; H01L 29/0865
USPC .......................................... 257/331; 438/270
See application file for complete search history.

(56) References Cited

U.S. PATENT DOCUMENTS

| 6,573,558 | B2 * | 6/2003 | Disney ........................ 257/328 |
| 2005/0167742 | A1 | 8/2005 | Challa et al. |
| 2007/0132014 | A1 | 6/2007 | Hueting |
| 2007/0138547 | A1 | 6/2007 | Nakamura |
| 2008/0135930 | A1 * | 6/2008 | Saito .......................... 257/330 |
| 2008/0160705 | A1 * | 7/2008 | Disney ........................ 438/283 |
| 2010/0065903 | A1 * | 3/2010 | Parthasarathy et al. ....... 257/329 |
| 2010/0072540 | A1 * | 3/2010 | Disney ........................ 257/328 |
| 2010/1155773 | | 6/2010 | Parthasarathy et al. |

FOREIGN PATENT DOCUMENTS

| JP | 2005327806 A | 11/2005 |
| JP | 2010238721 | 10/2010 |

* cited by examiner

*Primary Examiner* — Zandra Smith
*Assistant Examiner* — Toniae Thomas
(74) *Attorney, Agent, or Firm* — Patterson & Sheridan, LLP

(57) ABSTRACT

The performance of power semiconductor device of partial gate type structure may be improved by providing the source region only adjacent the gate electrodes in the structure, and providing the contact spaced from the gate by the source. The device includes a plurality of field plate electrodes which extend inwardly of the drift layer, a second field plate electrode disposed between the contact and one of the first field plate electrodes, and a gate electrode located between the source and a second one of the first field plate electrode.

20 Claims, 15 Drawing Sheets

$$R = \frac{\rho h}{2a} + \frac{\rho}{\pi^2}\left(\frac{a}{b}\right)\sum_{n=1}\frac{1}{n^2}\tanh\left(\frac{n\pi h}{a}\right)\sin\left(\frac{n\pi b}{a}\right) \quad \cdots (1)$$

$$R_0 = \frac{\rho h}{2a} \quad \cdots (2)$$

$$R_{sp} = \frac{\rho}{\pi^2}\left(\frac{a}{b}\right)\sum_{n=1}\frac{1}{n^2}\tanh\left(\frac{n\pi h}{a}\right)\sin\left(\frac{n\pi b}{a}\right) \quad \cdots (3)$$

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2012-205047, filed Sep. 18, 2012; the entire contents of which are incorporated herein by reference.

FIELD

Embodiments described herein relate to a semiconductor device and its manufacturing method.

BACKGROUND

Recently, due to the requirement of a high efficiency and energy-saving technique, power semiconductor devices as examples of the power MOSFET are required to become more and more compact, have a high breakdown voltage, a low on-resistance and low-capacitance. To fulfill this requirement, the technique of locating a field plate electrode in the power semiconductor is gaining attention.

In such semiconductor devices, when voltage between the source and drain is impressed, an electric field is generated between the field plate electrode and drift layer and depletion of the drift layer occurs, and as a result, a high withstand voltage value is created across the source and drain. Moreover, a comparatively high dopant concentration of the drift layer is required to obtain this extent of depletion of the drift layer, and thus, the on-resistance (Ron) across the channel region between the source and drain is reduced (i.e., the leakage current threshold is lower as well).

However, in this type of semiconductor devices, the capacitance (Cgs) between the gate electrode and the field plate electrode increases due to setting of the field plate electrode (FIG. 8) which is not suited to high speed operation and this is a matter of concern. To solve this problem, high speed semiconductors having so called partial type gate structures are gaining attention (FIG. 9). Consequently, such types of semiconductor devices are required to have a higher resistance and higher fabrication yield.

DETAILED DESCRIPTION

Figure 1:
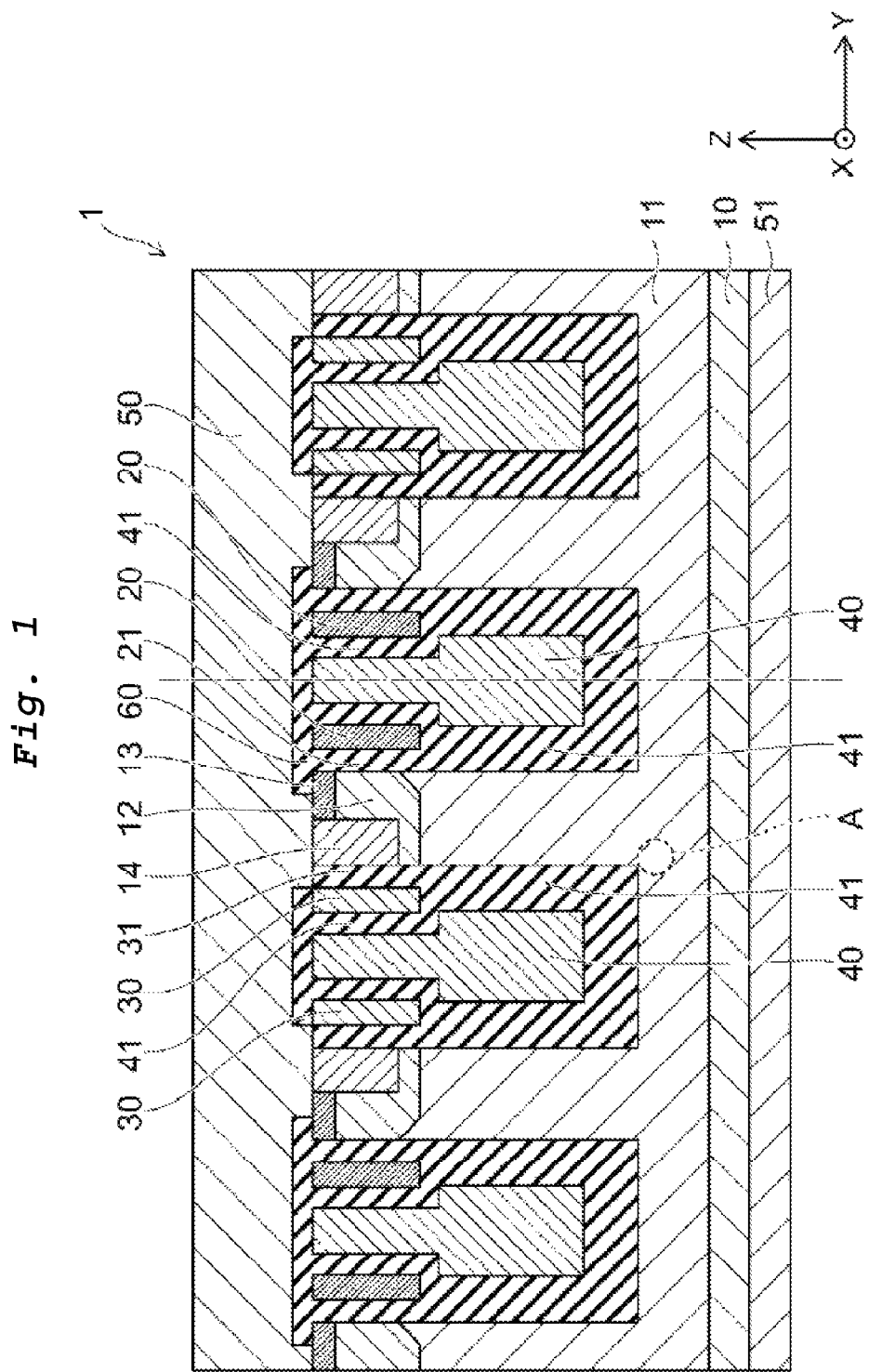
FIG. 1 is a schematic cross-sectional view of the semiconductor device according to a first embodiment.

In general, according to the embodiments, the disclosure is explained with the reference to the drawings. In the following explanation, the same reference numerals are provided for the same structures, so an explanation about the structures explained previously is omitted.

The semiconductor device of one embodiment is provided with a first semiconductor layer of the first conductive type, a second semiconductor layer of the second conductive type formed on the first semiconductor layer, a first semiconductor region of the first conductive type formed on the second semiconductor layer, and a second semiconductor region of the second conductive type that comes in contact with the first semiconductor region formed on the second semiconductor layer. Further, the second semiconductor region has a higher concentration of impurity elements than in the second semiconductor layer; it also has a first electrode that comes in contact with the first semiconductor region, second semiconductor layer and first semiconductor layer through the first insulating film, a second electrode that comes in contact with the second semiconductor region through a second insulating film, a third electrode connected to the first semiconductor region as well as second semiconductor region, and a fourth electrode electrically connected to the first semiconductor layer.

First Embodiment

FIG. 1 is a schematic cross-sectional view of the semiconductor device according to the first embodiment.

Figure 2:
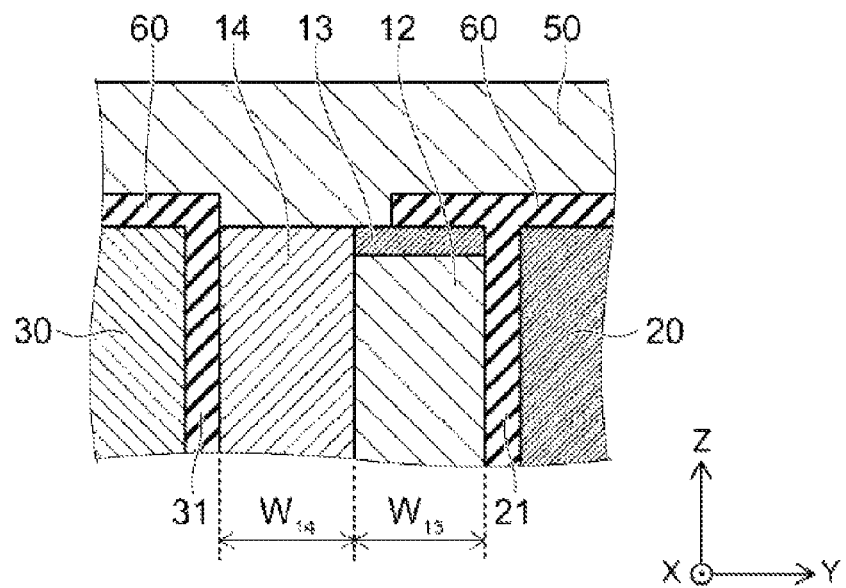
FIG. 2 is an enlarged schematic cross-sectional view of the vicinity of the base layer of the semiconductor device according to the first embodiment.

FIG. 2 is an enlarged schematic cross-sectional view of the region of the base layer of the semiconductor device according to the first embodiment.

A semiconductor device 1 according to the first embodiment is a MOSFET (Metal Oxide Semiconductor Field Effect Transistor) with a vertical electrode structure. The semiconductor device 1 has a trench gate structure with a vertically extending gate electrode 20.

In the semiconductor device 1, an $n^-$ type drift layer 11 (first semiconductor conductor layer) is formed on the $n^+$ type on a drain layer 10. A p type base layer 12 (second semiconductor layer) is formed on the drift layer 11. An n+ type source region 13 (first semiconductor region) is formed on the base layer 12. Moreover, a $p^+$ type contact region 14 (second semiconductor region) is formed on the base layer 12 in such a way that it contacts the source region 13. The contact region 14 has a higher impurity element concentration than the base layer 12.

Further, in the semiconductor device 1, the gate electrode 20 (first electrode) is brought in contact with the source region 13 through a gate insulation film 21 (first insulation film), the base layer 12 and the drift layer 11. A first field plate electrode 30 (second electrode) is brought in contact with the contact region 14 through a first field plate insulation film 31 (second insulation film). The base layer 12, the source region 13, and the contact region 14 are interposed between adjacent gate electrodes 20 and first field plate electrodes 30. The length of the Z direction of the gate electrode 20 and the length of the Z direction of the first field plate electrode 30 are the same. Additionally, in the structure of the semiconductor device 1, the first field plate insulation film 31 is disposed between the first field plate electrode 30 and the contact region 14, the source region 13 is disposed between the contact region 14 and the gate insulation film 21, and the gate electrode 20 is located adjacent the gate insulation film 21 on the opposite side thereof from that of the source region 13.

Moreover, in the semiconductor device 1, a source electrode 50 (the third electrode) overlies and is connected with the source region 13 and the contact region 14. An interlayer dielectric film 60 is provided between one part of the source region 13 and the source electrode 50, between the gate electrodes 20 and the source electrode 50, between the first field plate electrodes 30 and the source electrode 50 and between the second field plate electrodes 40 and the source electrode 50. Drain electrode 51 (the fourth electrode) underlies and is connected with the drain layer 10. In short, drain electrode 51 is electrically connected with the drift layer 11. Moreover, the first field plate electrode 30 and the second field plate electrode 40 are electrically connected with the source electrode 50.

Further, in the semiconductor device 1, the width $W_{13}$ of the source region 13 in the Y direction in the figure and the width $W_{14}$ of the contact region 14 in the Y direction are the same between each of the first and second structures.

As is also shown in FIG. 1, first structures having a second field plate electrode 40 interposed between two first field plate electrodes, and a second structure wherein a second field plate electrode 40 is interposed between adjacent gate electrodes, extend inwardly of the N-drift layer 11 are alternate therein along the Y direction of the device. The main component of each of the four electrodes, the drain layer 10, the drift layer 11, the base layer 12, the source region 13, and the contact region 14 is silicon (Si), for example; the gate electrode 20 and the second field plate electrode 40 comprise doped polysilicon; and each of the gate insulation film 21, the first field plate insulation film 31, and the second field plate insulation film 41 are formed of silicon oxide. The source electrode 50 and drain electrode 51 are metal layers.

In the first embodiment, n+ doped, n doped, and n− doped materials may be used as the first conductive type. For example, these materials may be doped with phosphorus (P) and/or arsenic (As). The p+ doped and p doped materials are thus of a second conductive type. As a dopant for the second conductive type, boron (B) may be used.

The manufacturing process of the semiconductor device 1 according to the first embodiment is explained. FIG. 3 to FIG. 7 are schematic cross-sectional views for explaining the manufacturing process of the semiconductor device according to the first embodiment.

Figure 3A:
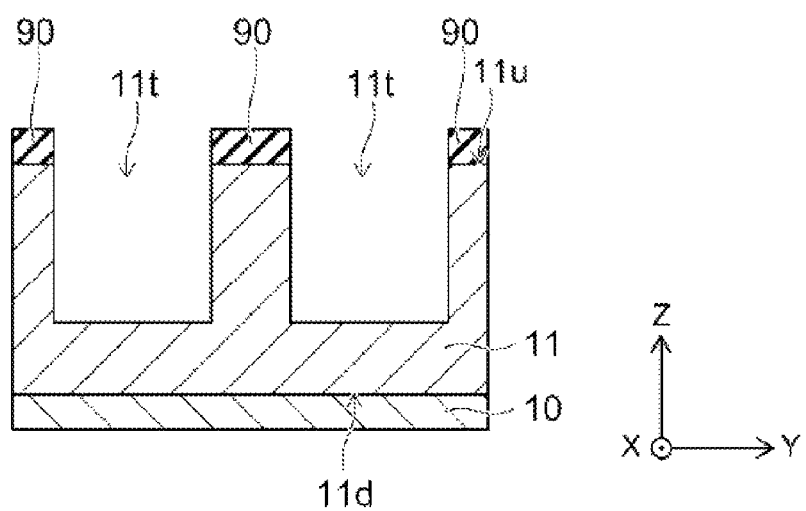
FIGS. 3A and 3B are schematic cross-sectional views illustrating the process of manufacturing the semiconductor device according to the first embodiment.

First, as shown in FIG. 3A, a pair of trenches 11t (first trench) are formed in the drift layer 11 formed on the drain layer 10. The drift layer 11 is an epitaxial doped silicon layer formed on the drain layer 10. The thickness of the drift layer 11 may be for example 15 μm (microns).

The concentration of dopant (e.g., arsenic concentration) in the drain layer 10 is $2 \times 10^{19}$ (atoms/cm$^3$). The concentration of dopant (e.g., arsenic concentration) included in the drift layer 11 is $2 \times 10^{16}$ (atoms/cm$^3$).

The trench 11t is directionally formed (etched) in the Z direction from the upper side 11u of the drift layer 11 and terminates within the drift layer 11 above the lower side 11d of the drift layer 11. Prior to etching 19 a mask layer 90 is deposited over the drift layer and lithographically patterned. RIE (Reactive Ion Etching) processing is performed on the drift layer 11 that is exposed within patterned openings in the mask layer 90. Each of the pair of trenches 11t extend in a direction (direction of X) parallel to upper surface 11u of the drift layer 11. The mask layer 90 is removed after the trench 11t is formed.

Figure 3B:
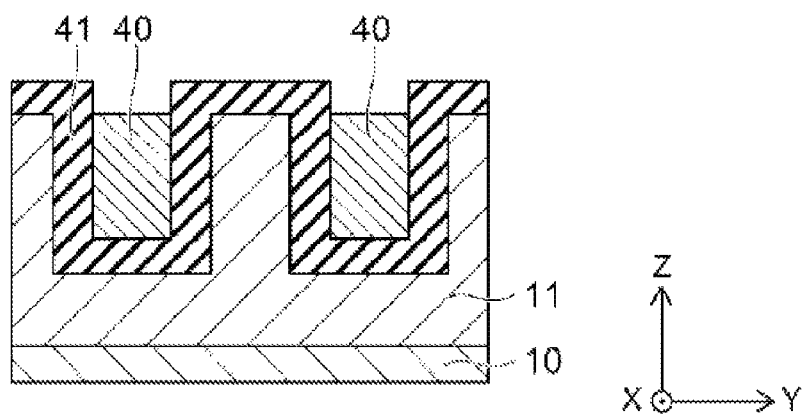

Next, as shown in FIG. 3B after forming the second field plate insulation film 41 on the inner wall of the trench 11t and the upper surface of drift layer 11, a film layer to form the second field plate electrode 40 is formed inside the trench 11t over the second field plate insulation film 41. Simultaneously, a film layer to form the second field plate electrode 40 is deposited in the drift layer 11 over the second field plate insulation film 41. Thereafter, the film layer to form second field plate electrode 40 is etched back to form the structure shown in FIG. 3B.

As described above, the second field plate electrode 40 contains polysilicon. This polysilicon layer is formed by CVD (Chemical Vapor Deposition). Moreover, a heating process is performed on the polysilicon layer in an atmosphere of phosphoryl chloride (POCl$_3$) to diffuse phosphorous into the layer to form an N doped electrode. The concentration of impurities (e.g., phosphorus concentration) in the second field plate electrode 40 is $1 \times 10^{20}$ (atoms/cm$^3$).

Figure 4A:
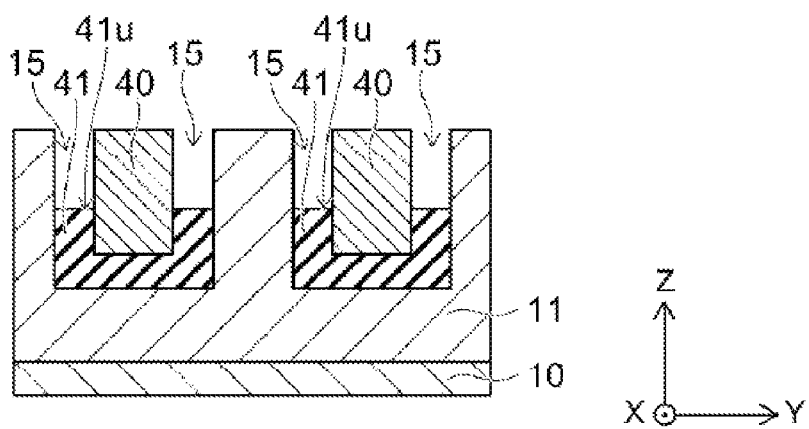
FIGS. 4A and 4B are schematic cross-sectional views illustrating the process of manufacturing the semiconductor device according to the first embodiment.

Next, second field plate insulation film 41 is etched off of the upper surface of the drift layer 11 and etched back below the surface of the field plate electrodes 40 as is shown in FIG. 4A. Etch back is done according to CDE (Chemical Dry Etching). As a result, a trench 15 (the second trench) is formed between the field plate electrodes 40 and the drift layer 11, which is bounded by a part of the second field plate electrode 40, top end 41u of the second field plate insulation film 41, and the drift layer 11.

Figure 4B:
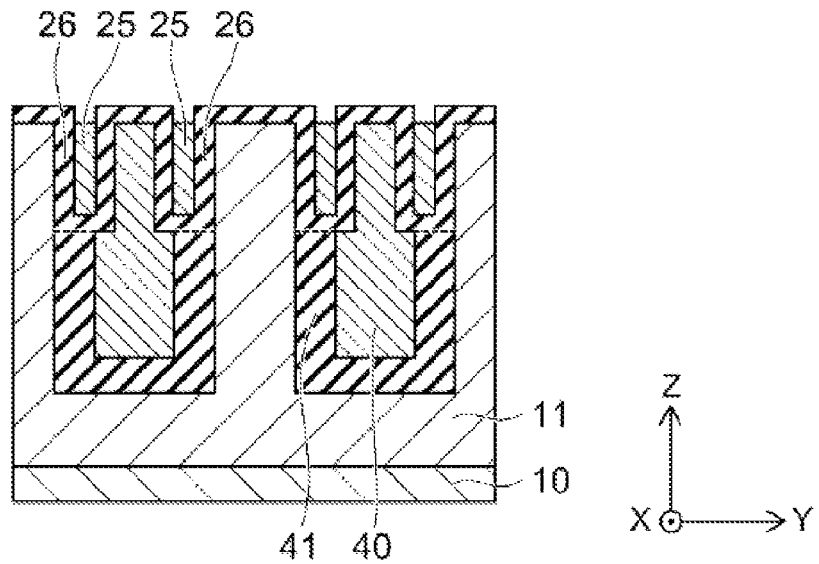

As shown in FIG. 4B, an insulating film 26 (fourth insulating film) is formed in the trench 15 and a conductive layer 25 is formed thereover. For example, the insulating film 26 is formed according to the thermal oxidation method. The insulating film is a thermally oxidized film formed on the inner wall of the trench 15. Thereafter, the conductive layer 25 is formed inside the trench 15 through the insulating film 26. The thickness of the insulating film 26 formed is, for example, 15 is 50 nm (nanometers). The method of forming the conductive layer 25 is similar to the method of forming the second field plate electrode 40.

During the step of forming the insulating film 26 by oxidation, because the second field plate electrode 40 is a doped polysilicon, it oxidizes faster than the adjacent drift layer. Accordingly, the width of the second field plate electrode 40 that comes in contact with the insulating film 26 is narrowed.

Figure 5A:
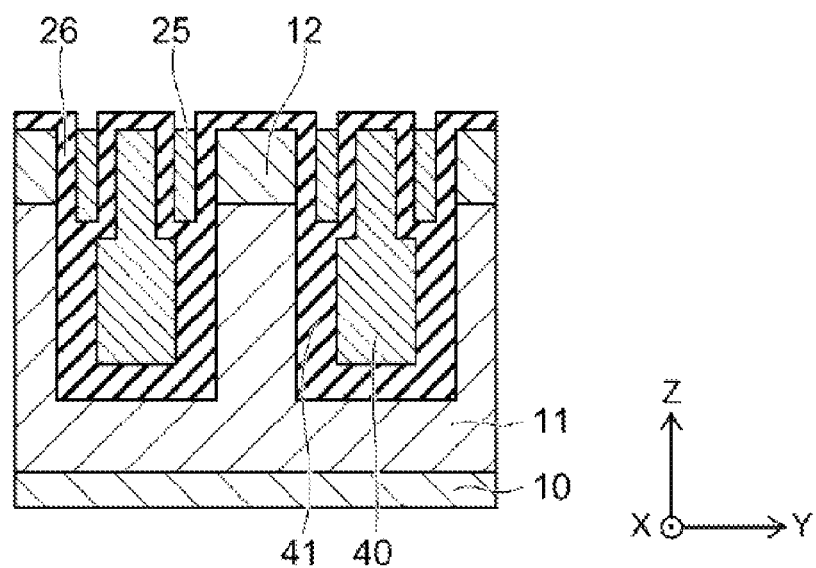
FIGS. 5A and 5B are schematic cross-sectional views illustrating the process of manufacturing the semiconductor device according to the first embodiment.

P type base layer 12 shown in FIG. 5A is formed by implanting a p type dopant element (such as boron) in the surface of the drift layer 11. For example, boron ions may be implanted into the entire upper surface of the drift layer 11. The dose amount of ion implantation is $2 \times 10^{13}$ (atoms/cm$^2$). The energy is 100 keV.

At this stage, counter ion implantation whereby the p type dopant element is implanted into the surface of the drift layer 11 is used. In this case, the concentration of the p type impurity element is greater than the concentration of the n type impurity element that was already included in the drift layer 11. Accordingly, a p type base layer 12 contacting the drift layer 11 is formed. In the base layer 12, a heating process is carried out when necessary to anneal out implant defects.

Figure 5B:
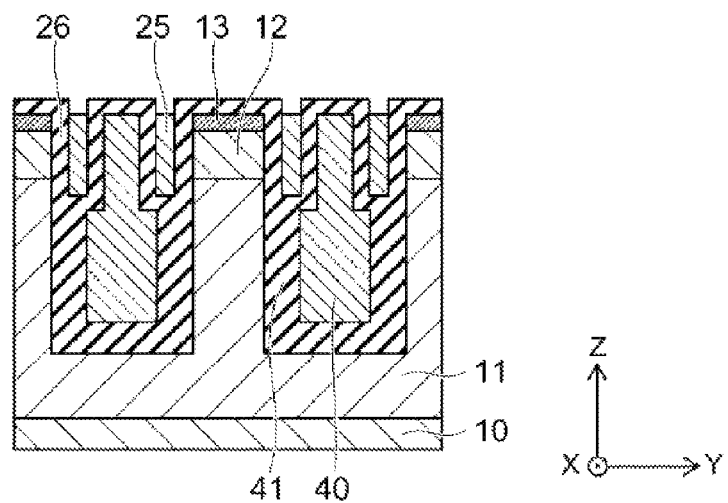

Thereafter, an n type dopant element (such as phosphorus or arsenic) is formed on the surface of the base layer 12 as is shown in FIG. 5B, to form the layer from which the n$^+$ source regions will be patterned. For example, phosphorus ions are implanted on the surface of the base layer 12. The dose amount of ion implantation is $2 \times 10^{15}$ (atoms/cm$^2$). The energy is 60 keV.

Again, to form the n$^+$ region in a p-doped layer, counter ion implantation is employed whereby the n type impurity element is formed on the surface of the base layer 12. In this case, the concentration of the n type dopant element is greater than the concentration of the p type impurity element that is included in the base layer 12. Accordingly, the n type source region 13 that comes in contact with the base layer 12 is formed.

Figure 6A:
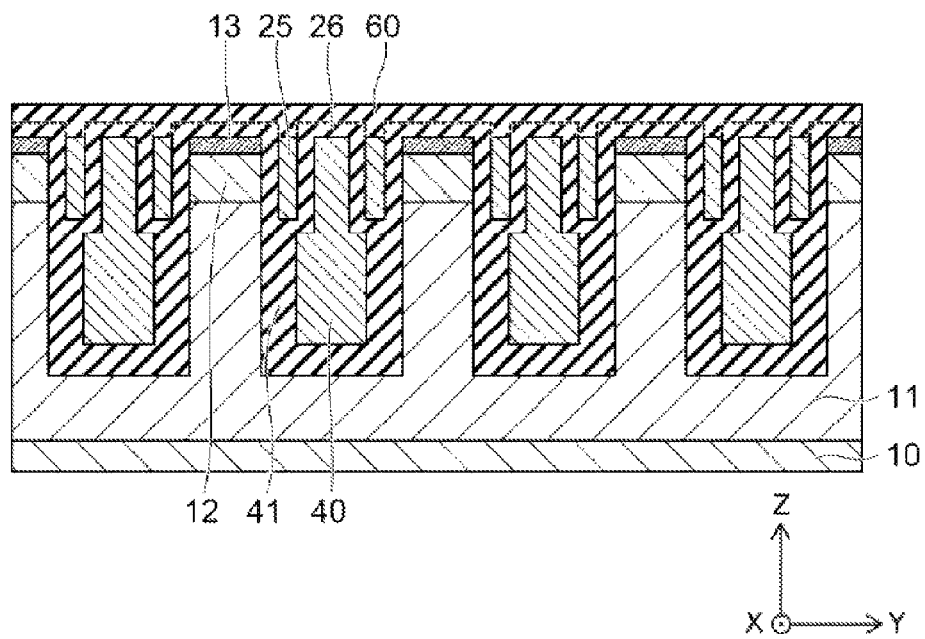
FIGS. 6A and 6B are schematic cross-sectional views illustrating the process of manufacturing the semiconductor device according to the first embodiment.

As shown in FIG. 6A, the interlayer dielectric film 60 is then formed above the source region 13, the second field plate electrode 40, the conductive layer 25 and the insulating film 26, respectively. The thickness of the interlayer dielectric film 60 is, for example, 1 μm. Thereafter, a mask layer 91 (FIG. 6B) is formed over the interlayer dielectric film 60.

Figure 6B:
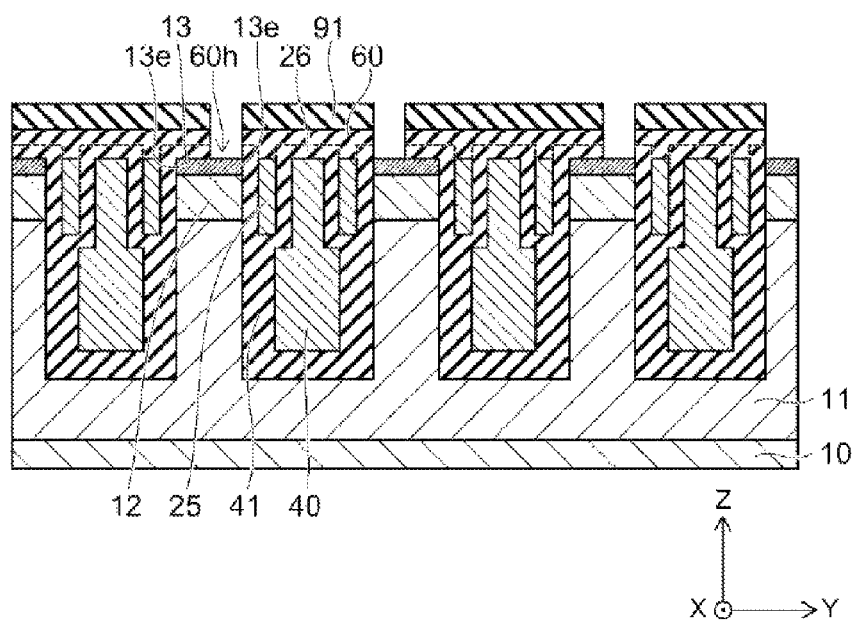

As shown in FIG. 6B, mask layer 91 on the interlayer dielectric film 60 is patterned. Further, an opening 60h is formed through the mask layer 91 and interlayer dielectric 60 so that the source region 13 is partially exposed from the interlayer dielectric film 60. Accordingly, the source region 13 is exposed on the portion thereof adjacent to the first structure incorporating field plate electrodes 30, but masked in the portion thereof adjacent to the second structure incorporating gate electrodes 20 (FIG. 1).

Figure 7A:
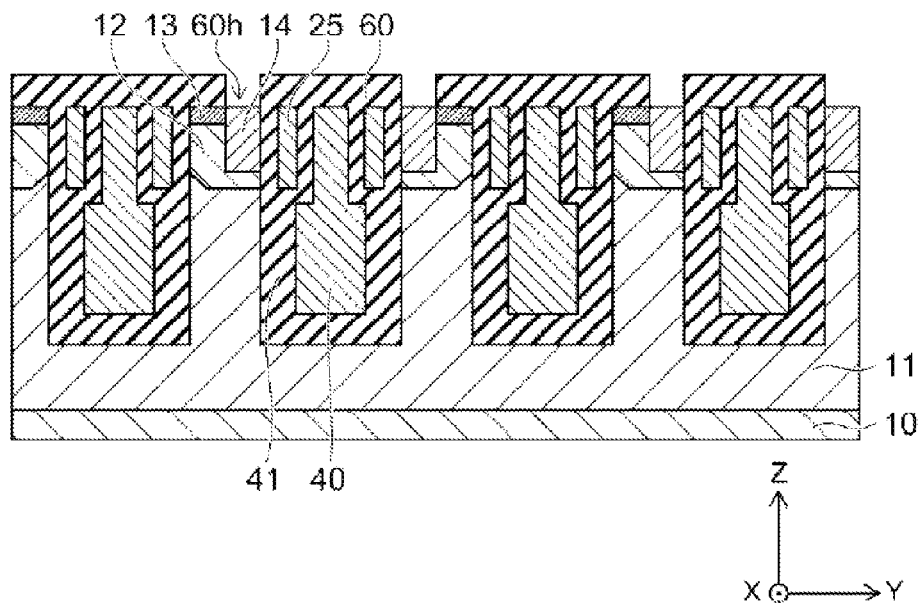
FIGS. 7A and 7B are schematic cross-sectional views illustrating the process of manufacturing the semiconductor device according to the first embodiment.

As shown in FIG. 7A, a p type dopant element (such as boron) is then formed on the portion of the source region 13 exposed by the opening 60h and in the portion of base layer 12 underlying the exposed portion of the source region 13. The dopant is ion implanted. The ion implantation can be done more than once. Accordingly, the p+ type contact region 14 that comes in contact with the base layer 12 and the source region 13 is formed. Further, a heating process can be carried out when necessary to anneal out implantation included defects.

Figure 7B:
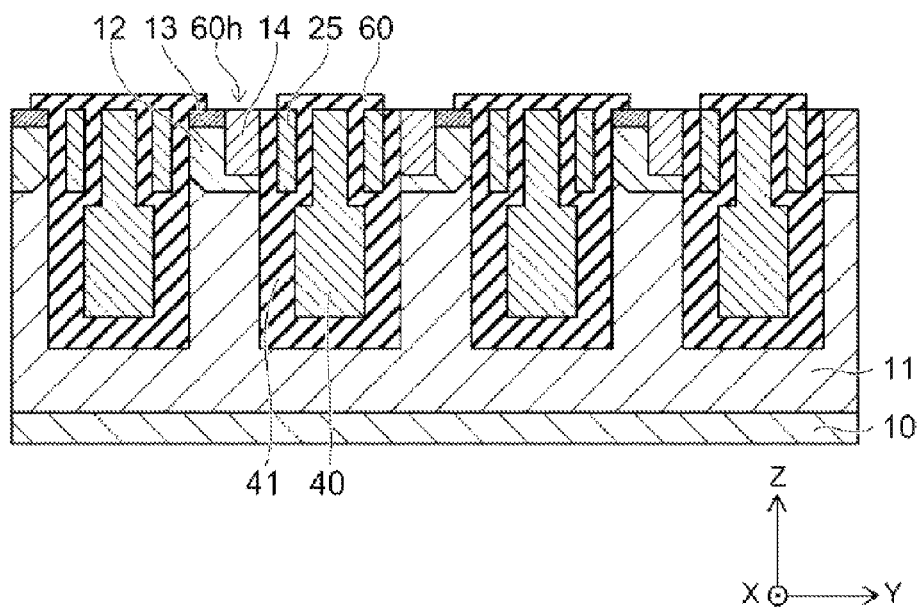

Thereafter as is shown in FIG. 7B, the width (width of Y direction in the figure) of the opening 60h at the respective horizontal directions (Y direction of the Figure) of the openings 60h through the interlayer dielectric film 60 is increased. For example, isotropic etching is performed the on the interlayer dielectric film 60. The width of the opening 60h widens by 0.5 μm due to the isotropic etching and the film thickness of the interlayer dielectric film 60 is simultaneously reduced. Thus, at least a portion of the source region 13 that was masked by the interlayer dielectric layer 60 adjacent to with the contact region 14 is exposed.

Further, as shown in FIG. 1, the source electrode 50 is deposited over the source region 13 the contact region 14 and the interlayer dielectric film 60. The drain electrode 51 can be electrically connected to the drift layer 11 by connecting the drain electrode 51 to the drain layer 10.

The portion of the conductive layer 25, where the source region 13 is spaced therefrom by only the gate insulator film 21, forms the gate electrodes 20. The portion of the conductive layer 25 that is spaced from the contact region 14 through the first field plate insulating film 31, forms the first field plate electrode 30. The respective gate insulator film 21 and the first field plate insulating film 31 become one of the parts of the insulating film 26.

The conductive layer 25 that comes in contact with the contact region 14 through the first field plate insulating film 31 is electrically connected to the source electrode 50 via polysilicon wiring (not shown in the figure). The second field plate electrode 40 is electrically connected to the source electrode 50 via polysilicon wiring (not shown in the figure). Further, the conductive layer 25 that comes in contact with the base layer 12 and the drift layer 11 through the gate insulator film 21 is connected by gate wiring (not shown in the figure). Thus, the semiconductor device 1 is formed using such a manufacturing process.

The semiconductor device according to the reference example is explained before explaining the effects of the first embodiment.

Figure 8:
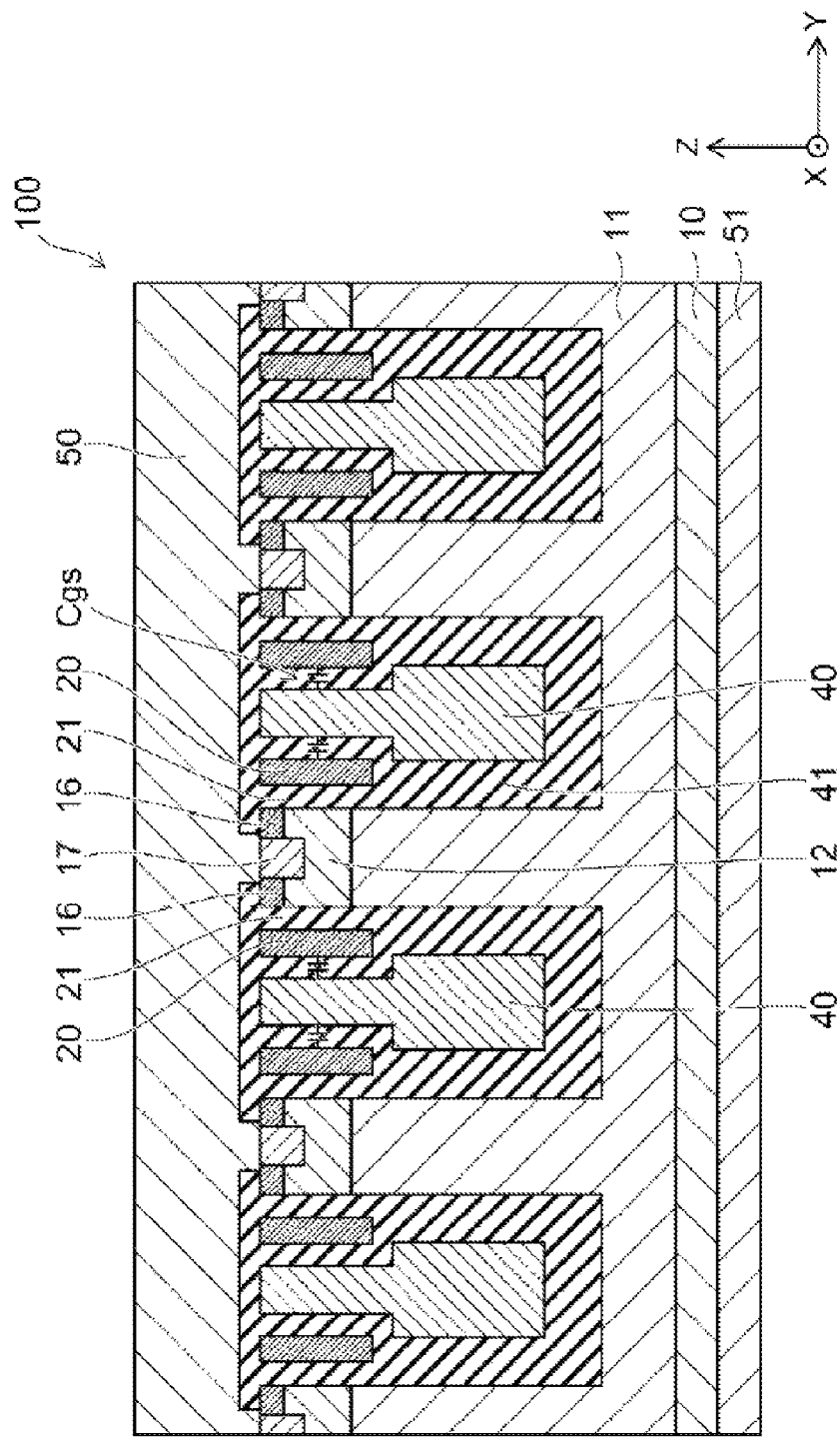
FIG. 8 is a schematic cross-sectional view of a semiconductor device according to a first reference example.

FIG. 8 is a schematic cross-sectional view of the semiconductor device according to Reference Example 1.

In a semiconductor device 100 according to Reference Example 1, n$^+$ type source regions 16 are located on both sides of a p+ type contact region 17. In other words, the contact region 17 is sandwiched by the source region 16. Here, the source region 16 corresponds to the source region 13 of the first embodiment. The contact region 17 corresponds to the contact region 14 of the first embodiment. Further, the gate electrode 20 is set as a substitute for the first field plate electrode 30 of the first embodiment. The rest of the composition of the semiconductor device 100 is the same as the semiconductor device 1.

Figure 9:
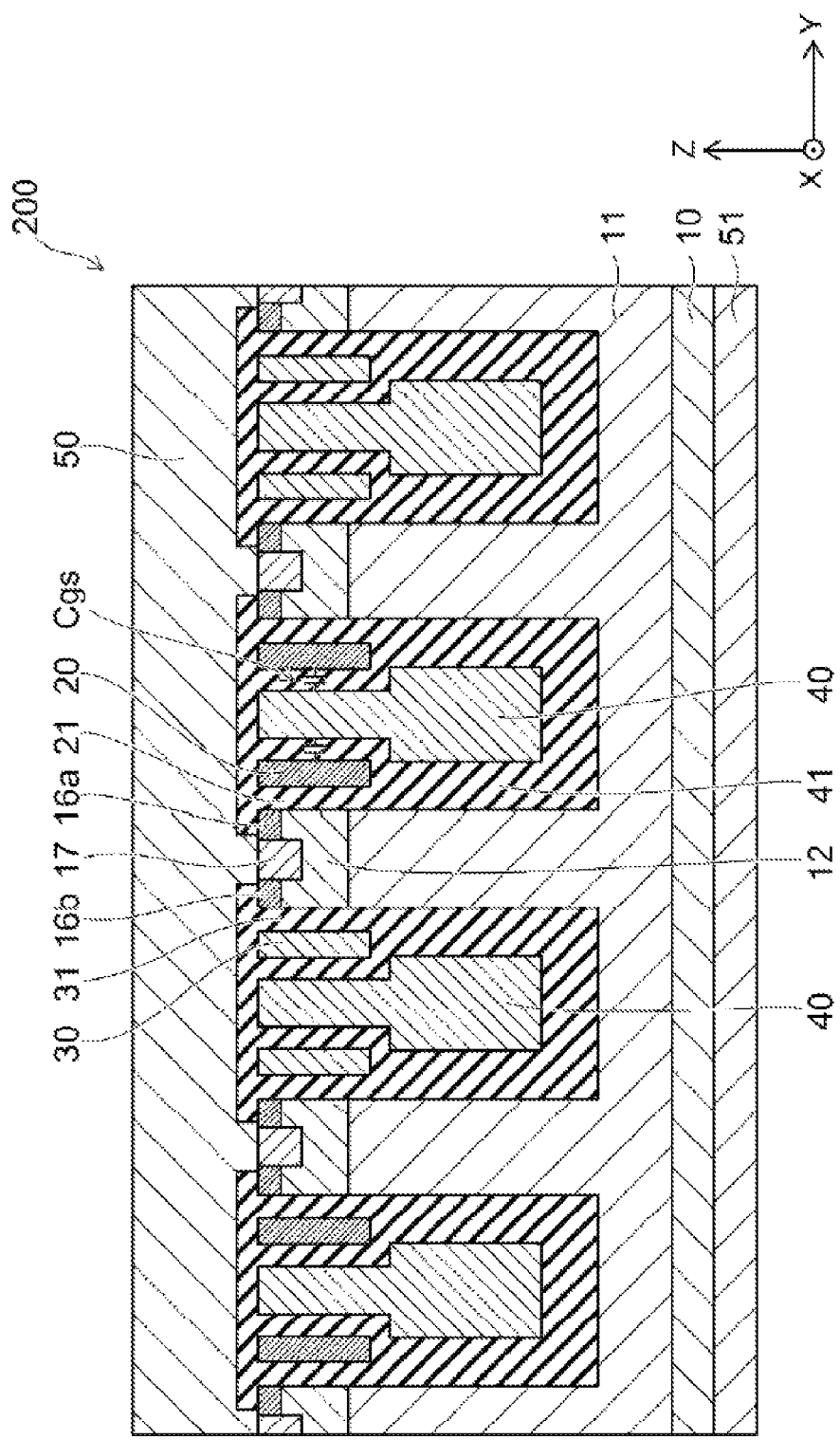
FIG. 9 is a schematic cross-sectional view of a semiconductor device according to a second reference example 2.

FIG. 9 is a schematic cross-sectional view of the semiconductor device according to Reference Example 2.

In a semiconductor device 200 according to Reference Example 2, n$^+$ type source regions 16a, 16b are located on both sides of the p+ type contact region 17. Here, the source region 16a corresponds to the source region 13 of the first embodiment. The contact region 17 corresponds to the contact region 14 of the first embodiment. The source region 16b present at the side of the first field plate electrode 30 remains as an unused region. The rest of the composition of the semiconductor device 200 is same as the semiconductor device 1.

In the semiconductor device 100 according to Reference Example 1, the gate electrode 20 is set as a substitute for the first field plate electrode 30. Therefore, internal capacity of gate-source (Cgs) becomes almost double the Cgs of the semiconductor device 1.

On the other hand, in the semiconductor device 200 according to Reference Example 2, half of the multiple gate electrodes 20 which are disposed in the semiconductor device 100 are substituted by the first field plate electrode 30. This structure is used even in the semiconductor device 1. More specifically, a partial type gate structure is used in the semiconductor device 200 and the semiconductor device 1. Accordingly, in the semiconductor device 200 and the semiconductor device 1, the internal capacity of the gate-source (Cgs) is decreased by half as compared to the Cgs of the semiconductor device 100.

In the semiconductor device 200 and the semiconductor device 1, the channel density is decreased by half as compared to the semiconductor device, and the channel resistance is doubled. However, when the withstand voltage exceeds 100 V, as for the proportion of each resistance in relation to the total resistance, the resistance of the drift layer is extremely large and the channel resistance is less. In fact, the proportion of the channel resistance to drift layer resistance is 5 to 10%.

The increase of $R_{on}$ is gradual. On the other hand, $C_{iss}$ is decreased by nearly half. Therefore, the importance of the product of $R_{on}$ and $C_{iss}$ product used as an index of MOSFET characteristics is significantly reduced.

Here, $R_{on}$ is the on-resistance and $C_{iss}$ is $C_{gs}$ (internal capacity of gate-source)+$C_{gd}$ (internal capacity of gate-drain). Therefore, the switching speed of the semiconductor device 200 and the semiconductor device 1 is faster than the switching speed of the semiconductor device 100.

However, in the semiconductor device 200, the contact region 17 is sandwiched in between source regions 16a and 16b. In the semiconductor device 1, the contact region 14 is not disposed between the source region 13. However, the contact region 14 is located on the side of the first field plate electrode 30 and the source region 13 is located on the side of the gate electrode 20. The functional effect due to the differences of these structures is explained.

Figure 10A:
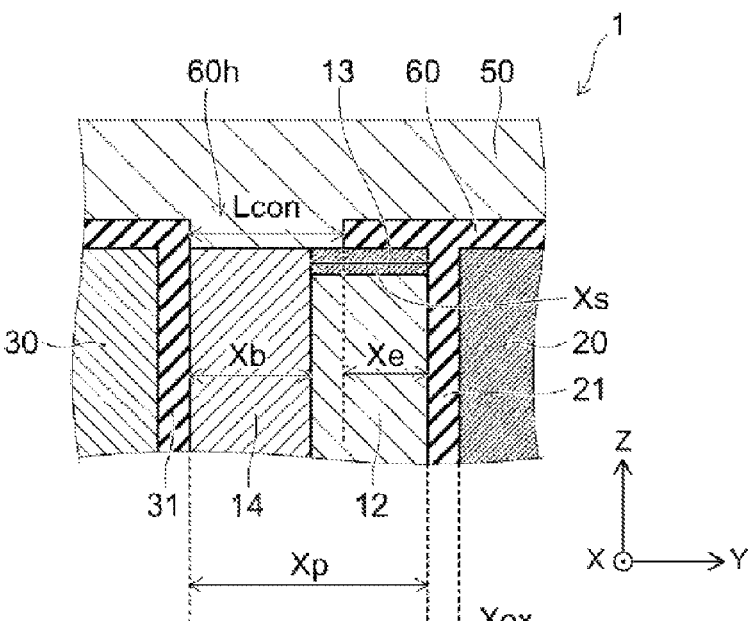
FIG. 10A is an enlarged schematic cross-sectional view of the vicinity of the base layer of the semiconductor device according to the first embodiment.
Figure 10B:
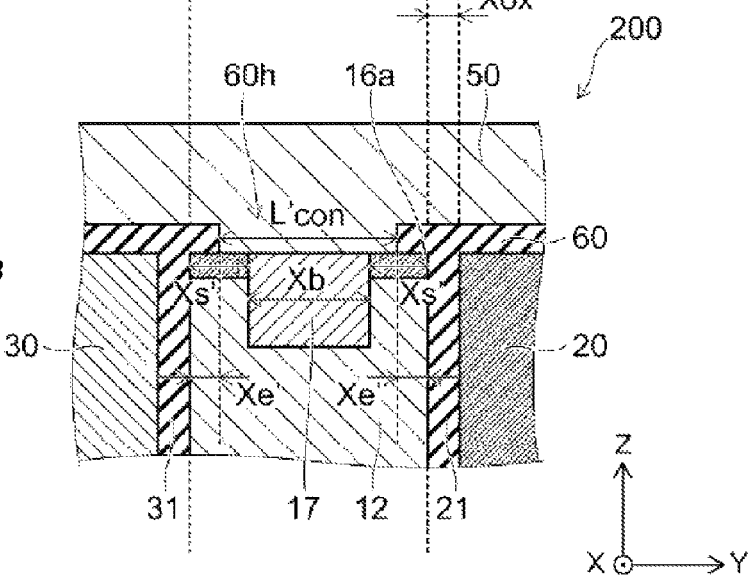
FIG. 10B is an enlarged schematic cross-sectional view of the vicinity of the base layer of the semiconductor device according to Reference Example 2.

Enlarged views of the base layer of the semiconductor devices 1 and 200 are shown in FIGS. 10A and 10B.

FIG. 10A is a schematic cross-sectional enlarged view of a portion near the base layer of the semiconductor device according to the first embodiment. FIG. 10B is a schematic cross-sectional enlarged view of a portion near the base layer of the semiconductor device according to Reference Example 2.

In FIG. 10A, the width of the opening 60h is expressed by "Lcon". The width of the source region 13 is expressed by "Xs". The width of the contact region 14 is expressed by "Xb". The width of a semiconductor layer extending between the gate insulator film 21 and the first field plate insulating film 31 is expressed by "Xp". The thickness of the gate insulator film 21 is expressed by "Xox". The width from the end of the opening 60h to the surface of the gate insulator film 21 is expressed by "Xe". In FIG. 10A, the equation of Xp=Xs+Xb is established.

In FIG. 10B, the width of the opening 60h is expressed by "Lcon". The width of the source region 13 is expressed by "Xs'". The width of the contact region 14 is expressed by "Xb". "Xb" of the semiconductor device 200 is equivalent to "Xb" of the semiconductor device 1. The width of a semiconductor layer disposed between the gate insulator film 21 and the first field plate insulating film 31 is expressed by "Xp". In this example, "Xp" of the semiconductor device 200 is equivalent to "Xp" of the semiconductor device 1. The thickness of the gate insulator film 21 is expressed by "Xox". Again, in this example, "Xox" of the semiconductor device 200 is equivalent to "Xox" of the semiconductor device 1. The width from the end of the opening 60h to the surface of the gate insulator film 21 (or first field plate insulating film 31) is expressed by "Xe". In FIG. 10B, the equation of Xp=2Xs'+Xb' is established.

In the semiconductor devices 1 and 200, if a voltage that is more than or equal to the threshold value is applied to the gate electrode 20, the channels are formed along the surface boundary of the gate insulator film 21 and the base layer 12. Accordingly, the semiconductor device is set to the on-state and the electric current flows between the source and drain through the channels. Further, at the time of avalanche breakdown, the electron hole generated in the drift layer 11 is discharged by the source electrode 50 through the contact regions 14, 17.

Here, "Xs" of the semiconductor device 1 is larger than "Xs'" of the semiconductor device 200. Accordingly, the spreading resistance in the source region 13 of the semiconductor device 1 is less than the spreading resistance in the source region 16a of the semiconductor device 200. Thus, the on-resistance of the semiconductor device 1 is also less than the on-resistance of the semiconductor device 200.

Here, the concept of spreading resistance is explained.

Figure 11:
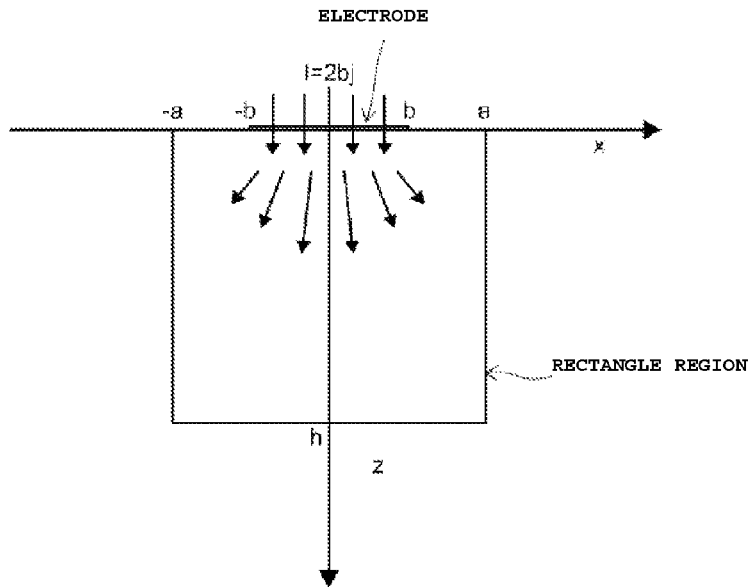
FIG. 11 is a schematic diagram illustrating the spreading resistance.
Figure 12:
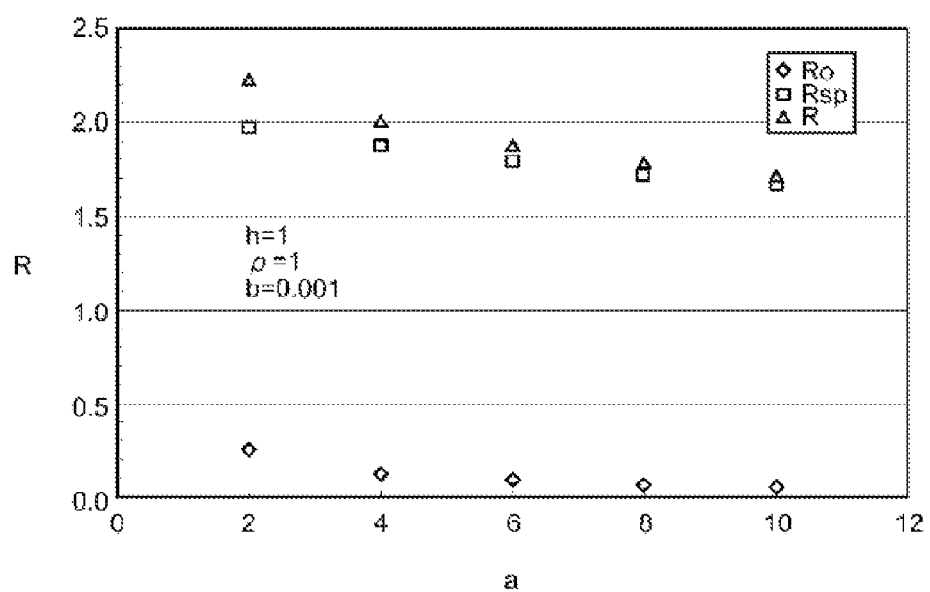
FIG. 12 is a schematic diagram illustrating the spreading resistance.

FIG. 11 and FIG. 12 are schematic diagrams where spreading resistance is explained.

As shown in FIG. 11, a rectangular region of horizontal length 2a and vertical length h is considered with respect to the specific resistance ρ. Moreover, an electrode of width 2b is formed on the rectangular region.

If the resistance when electric current flows to the bottom side of the rectangular region of width 2a from the electrode of width 2b is obtained, this resistance R becomes equal to formula (1) in the diagram obtained analytically. The first parameter (in other words, formula (2)) of formula (1) corresponds to the resistance when the current flows equally from the upper surface of the rectangle to the side of the lower surface of the rectangle. Actually, the resistance increases since the width of the electrode through which the electric current flows is narrow. This increment is shown in the second parameter (in other words, formula (3)) of the formula (1). This formula (3) is called the spreading resistance.

The dependability of "a" of the resistance value when b=0.001, h=1, and ρ=1 is shown in the FIG. 12. The horizontal axis of FIG. 12 is the value of "a" and the vertical axis is the resistance value R.

When the width of the inflow electrode is narrow, the spreading resistance decreases if the bottom at which receives the electric current becomes large; as a result, the total resistance decreases. When it corresponds to the first embodiment, though the top and bottom of the rectangle is reversed, it is about 10 nm or less and "Xs" corresponds to "a" according to the extent of inversion of the channel as it corresponds to "b".

Since "Xs" of the first embodiment is larger than "Xs" of the reference example, the spreading resistance of the source region 13 of the semiconductor device 1 decreases more than the spreading resistance of the source region 16a of the semiconductor device 200. As a result, the on-resistance of the semiconductor device 1 decreases more than the on-resistances of the semiconductor device 200.

Moreover, where Xs>Xs' in the semiconductor device 1, the contact margin, in which the source region contacts the source electrode 50, expands as compared to the semiconductor device 200. For instance, the source region 13 can be exposed from the interlayer dielectric film 60 by exceeding the width of Xs' in the semiconductor device 1. As a result, the on-resistance of the semiconductor device 1 decreases further as compared to the on-resistance of the semiconductor device 200.

Moreover, in the semiconductor device 1, there is 1 p-n junction between the contact region 14 and the source region 13 as compared to the 2 p-n junctions between the contact region 17 and the source regions 16a, 16b in the semiconductor device 200. A depletion layer is formed in this p-n junction part. Therefore, the resistance of the p-n junction part increases as compared with parts other than the p-n junction part.

As a result, the resistance of the contact region 14 decreases as compared with the resistance of the contact region 17. Therefore, in the semiconductor device 1, the emission effect of the hole to the source electrode 50 which passes through the contact region is accelerated. As a result, the avalanche resistance of the semiconductor device 1 increases further as compared to the avalanche resistance of the semiconductor device 200.

Moreover, in the semiconductor device 1, the contact region 14 contacts the first field plate insulating film 31. In the semiconductor device 1, the hole generated in the region enclosed by A in FIG. 1 at the time of breakdown moves in the direction of the base layer 12 from the drain layer 10 along the interface between the second field plate insulating film 41 and the drift layer 11. Therefore, the hole is easily emitted in the source electrode 50 through the contact region 14 arranged on it.

Moreover, it is assumed that Xp=3.0 μm, Xox=0.05 μm, Xb=1.5 μm, Xs=1.5 μm, Xs'=0.75 μm, as an example.

In this case, in order to have excellent electrical contact with the source region and the source electrode 50, it is desirable that the contact length with the source region and the source electrode 50 is 0.25 μm for instance. The contact length with the source region and the source electrode 50 is shown by "Xs–Xe" of FIG. 10A and "Xs'–Xe'" of FIG. 10B.

Moreover, after the opening 60h is formed, it is desirable to ensure that 0.5 μm, for instance, is the thickness of the interlayer dielectric film 60.

In the semiconductor device 200, it is assumed for instance, that Xe'=0.5 μm, Lcon'=2.0 μm. In the semiconductor device 200, when the position of the opening 60h shown in the figure shifts by 0.25 μm to the right and left, "Xe'" becomes 0.25 μm to 0.75 μm. Here, when a position of the opening 60h shifts to the right by 0.25 μm compared to the target position thereof and when Xe' of the source region 16a becomes 0.25 μm, the distance between the source electrode 50 and the gate electrode 20 is shortened. After isotropic etching there is a possibility that the source electrode 50 and the gate electrode 20 will be short-circuited.

In contrast, in the semiconductor device 1, even when the contact width between the source region 13 and the source electrode 50 is 0.25 μm, it is maintained at 1.25 μm for "Xe". In this case, Lcon=1.75 μm. Therefore, in the semiconductor device 1, even if the position of the opening 60h shifts by 0.25 μm to the right and left, "Xe" is maintained at 1.5 μm to 2.0 μm.

As a result, the distance by which the withstand voltage between the source electrode 50 and the gate electrode 20 can be maintained. The short circuit between the source electrode and the gate electrode 20 does not occur easily. Furthermore, in the semiconductor device 1, when the opening 60h shifts to the left side, even if there is a short circuit between the first field plate electrode 30 and the source electrode 50, the first field plate electrode 30 and the source electrode 50 are at the same potential. In other words, no problems occur even if there is a short circuit between the first field plate electrode 30 and the source electrode 50. Thus, in the first embodiment, the accuracy of the position of the opening 60h is eased as compared with the reference example.

As explained above, the process margin expands in the first embodiment as compared to the reference example. Moreover, the manufacturing yield can be improved in the first embodiment by expanding the process margin.

Moreover, by shortening the distance between contact region and channel region, generally the dopant concentration of the channel region is easily influenced by the dopants in the contact region. However, the distance between the contact region 14 and the channel region in the semiconductor device 1 is distant as compared to the distance between the contact region 17 and the channel region in the semiconductor device 200. Consequently, in the semiconductor device 1, the dopant concentration of the channel region does not change easily. As a result, the threshold voltage (Vth) is stabilized in the semiconductor device 1.

Furthermore, by separating the contact region 14 from the channel region, the dopant concentration of the contact region 14 can be set to be higher than the dopant concentration of the channel region 17. As a result, resistance of the contact region 14 for the hole is lowered and the effect wherein the hole is emitted in the source electrode 50 through the contact region 14 is enhanced. As a result, the avalanche resistance of the semiconductor device 1 increases further. The semiconductor device 1 has an excellent performance in applications in which inductive loads such as motors and electromagnetic coils are connected.

Further, for the second field plate insulating film 41, dielectric constant can be graded stepwise or smoothly from the side of the drain layer 10 to the side of the base layer 12. In this case, the electric field of the silicon surface of the trench bottom is eased, which is advantageous for high potential operation.

Second Embodiment

Figure 13:
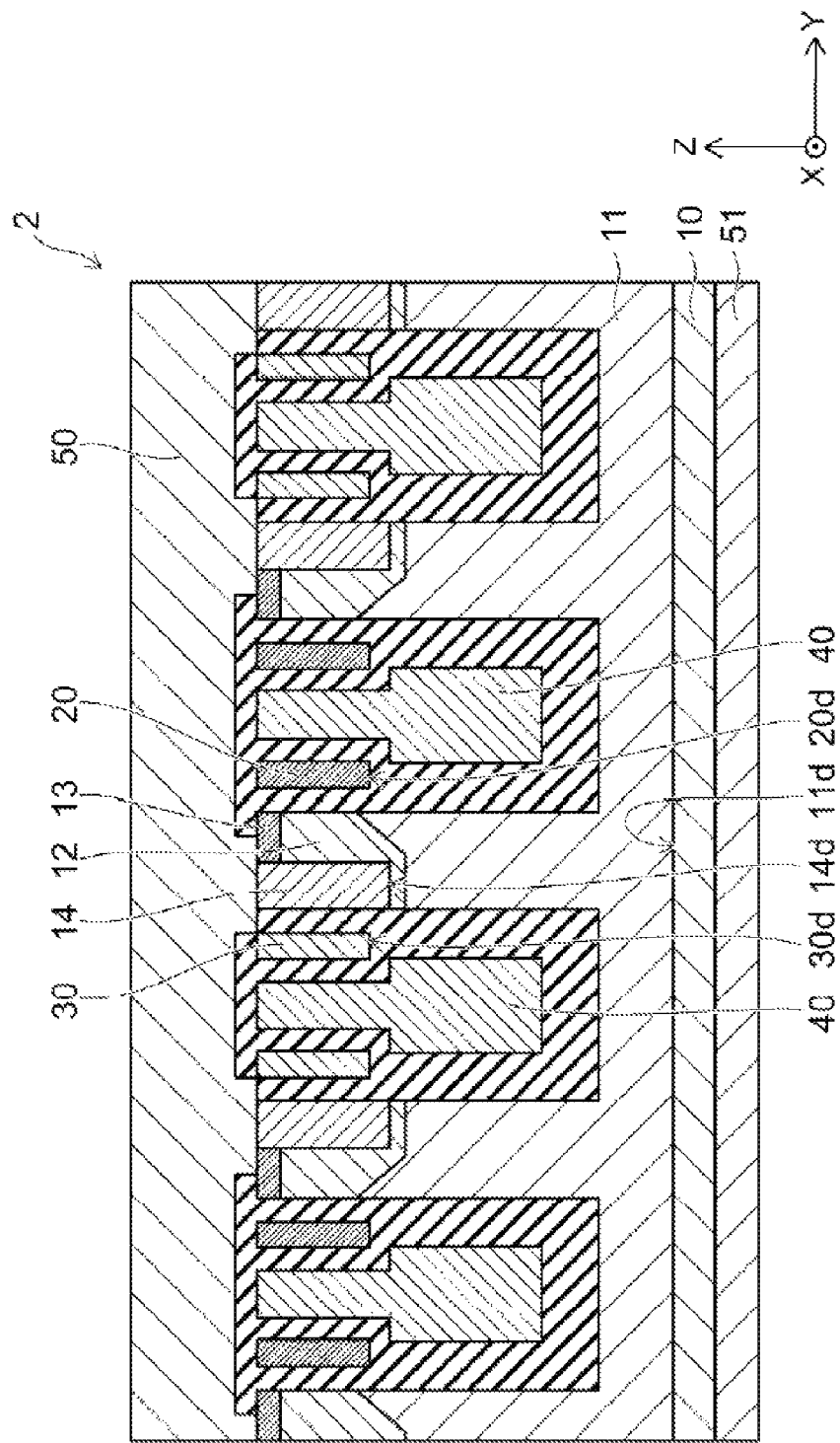
FIG. 13 is a schematic cross-sectional view of a semiconductor device according to a second embodiment.

FIG. 13 is a cross-sectional schematic diagram of the semiconductor device according to the second embodiment.

In the semiconductor device 2 of the second embodiment, the length between the lower end 14d of the contact region 14 and the lower surface 11d of the drift layer 11 is smaller than the length between the lower end 30d of the first field plate electrode 30 and the lower surface 11d of the drift layer 11. Lower end 14d of the contact region 14 is placed in the side lower than lower end 30d of the first field plate electrode 30. Lower end 14d of the contact region 14 is placed in the side lower than lower end 20d of the gate electrode 20 In other words, the contact region 14 extends further inwardly of the upper surface of the drift region 11 than do the gate electrodes and first field plate electrodes 20, 30. A structure other than this is equivalent to the semiconductor device 1.

In this structure, an electric field concentrated in lower end 20d of the gate electrode 20 is distributed even in lower end 14d of the contact region 14. Therefore, in semiconductor device 2, the generation of an avalanche is controlled and pressure resistance is improved more compared to the semiconductor device 1.

Third Embodiment

Figure 14:
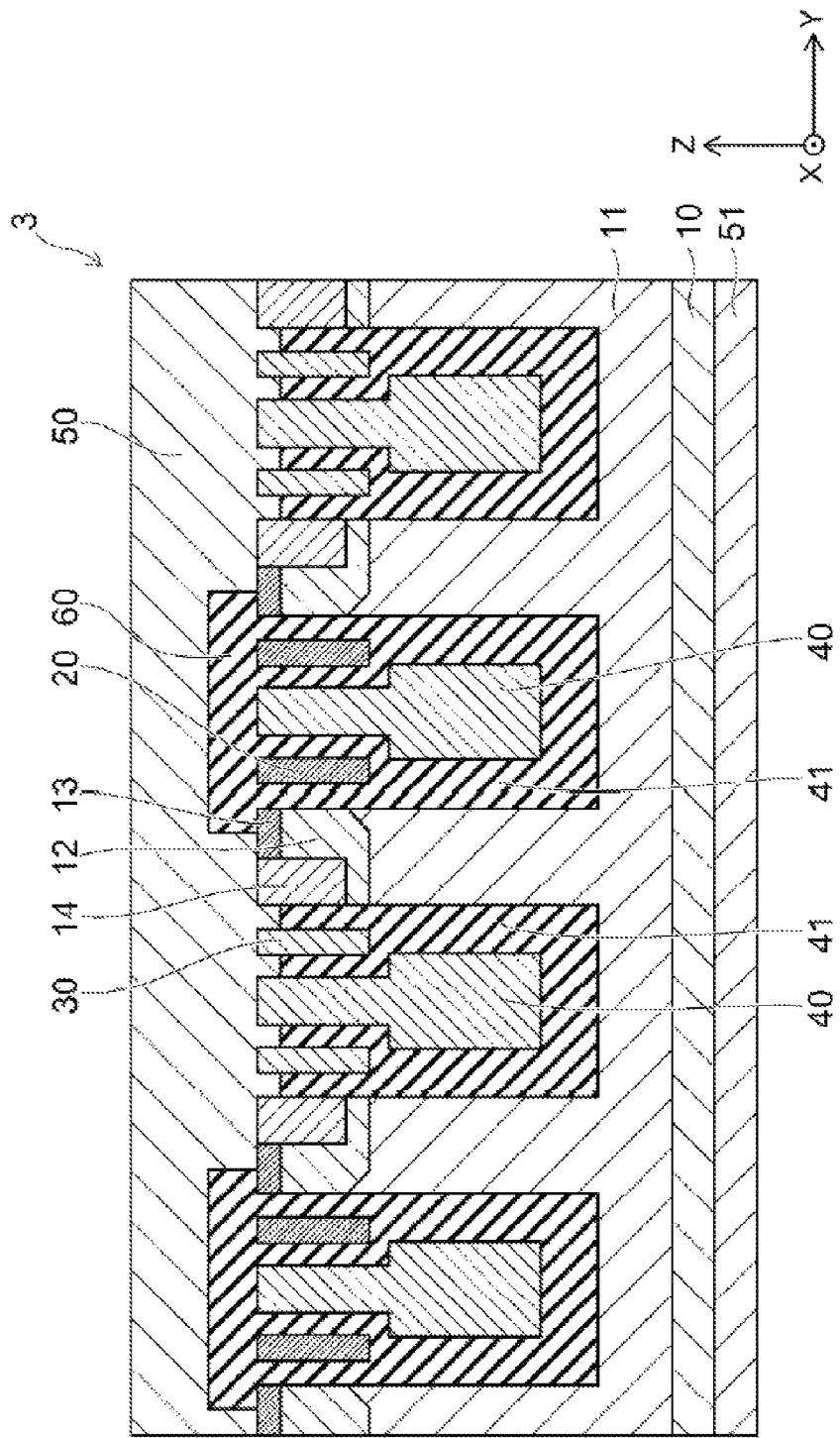
FIG. 14 is a schematic cross-sectional view of a semiconductor device according to a third embodiment.

FIG. 14 is cross-sectional diagram of semiconductor device according to the third embodiment.

In semiconductor device 3 of the third embodiment, the first field plate electrode 30 and the second field plate electrode 40 are in contact with the source electrode 50. For instance, in the step of FIG. 6B, the interlayer dielectric film 60 is etched to expose the portions of the conductive layer 25 which form the first field plate electrode 30 and second field plate electrode 40. Thus, the source electrode 50 is connected to the first and second field plate electrodes 30, 40.

In the case of this structure, polysilicon wiring that interconnects the first field plate electrode 30, the second field plate electrode 40 and the source electrode 50 becomes unnecessary. As a result, in addition to the effects of the first embodiment, the manufacturing process is shortened and a low fabrication cost results.

Fourth Embodiment

Figure 15:
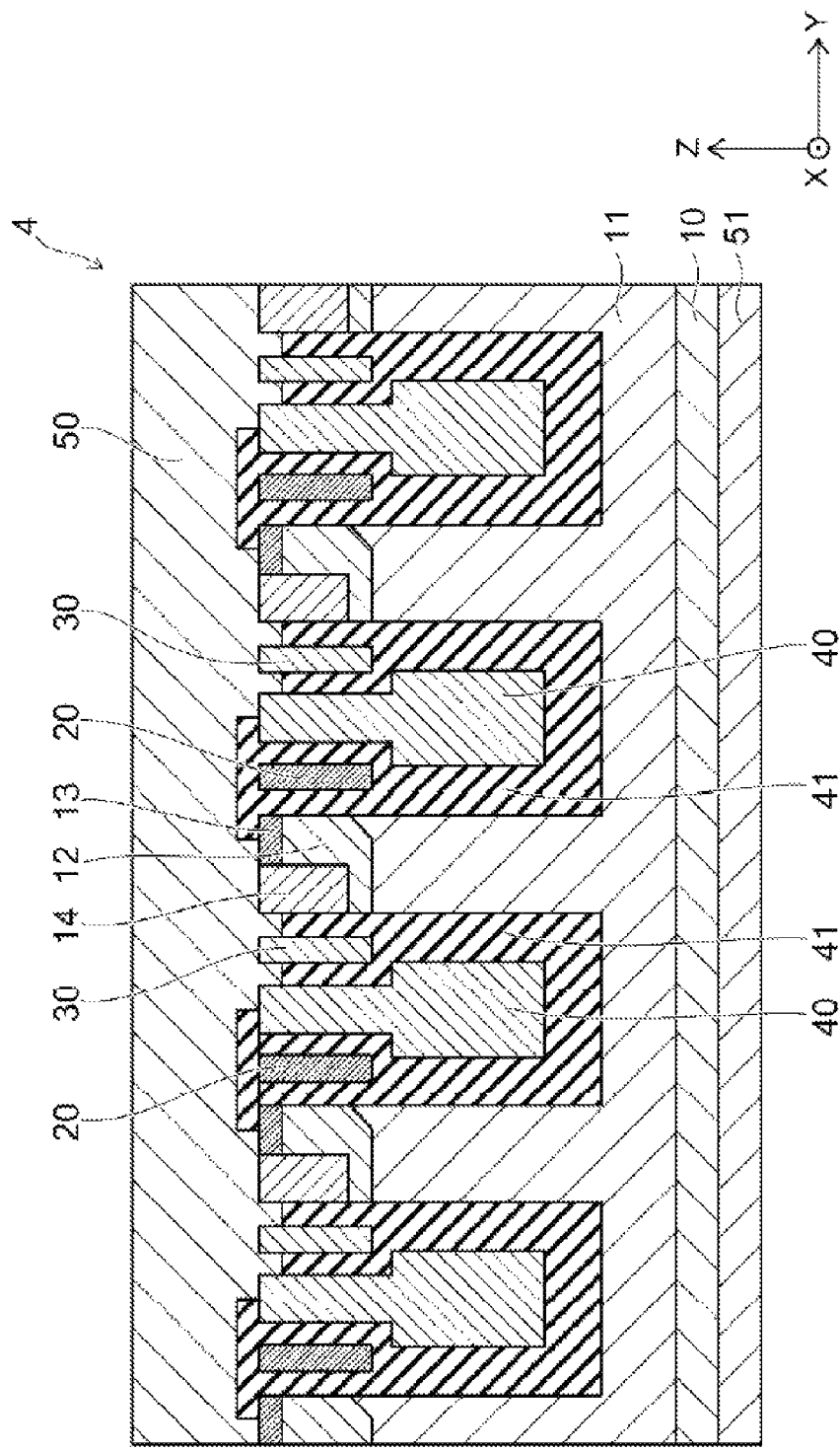
FIG. 15 is a schematic cross-sectional view of a semiconductor device according to a fourth embodiment.

FIG. 15 is a cross-sectional pattern diagram of the semiconductor device according to the fourth embodiment.

In semiconductor device 4 of the fourth embodiment, a gate electrode 20 and a first field plate electrode 30 are arranged on opposite sides of the second field plate electrode 40. Further, the first both field plate electrode 30 and the second field plate electrode 40 directly contact with the overlying source electrode 50.

If the structure is made in this way, separate polysilicon wiring to connect the first field plate electrode 30, the second field plate 40 and the source electrode 50 is not required. As a result, in addition to the effects of the first embodiment, the manufacturing process is shortened and low cost is implemented.

The embodiments are explained on the basis of the concrete example. However, these embodiments are not restricted to these concrete examples. In short, in these concrete examples, changes in the design made by a skilled person is in the scope of the embodiment as long as the characteristics of the embodiment are preserved. Each element and its arrangement, raw material, condition, shape and size are not restricted to the one illustrated and it can be suitably changed. For instance; in the semiconductor devices 1 to 4, IGBT can be considered by setting collector layer of the p$^+$ type between the drain layer 10 and the drift layer 11. In this case, the source region is called the emitter region and the drain layer is called as the collector layer.

Moreover, each element provided in the embodiments can be combined if technically possible. The combined part is also within the scope of the embodiments as long as the characteristics of the embodiments are preserved. Besides this, for a skilled person, various changes and the corrections can be considered if these changes and corrections are within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a drift layer;
   a first and a second field plate electrode extending inwardly of the drift layer in a first direction and spaced from the drift layer by an insulating layer, the first and the second field plate electrodes being spaced from each other in a second direction perpendicular to the first direction;
   a gate electrode extending inwardly of the drift layer in the first direction and between the first and the second field plate electrodes and spaced therefrom and from the drift layer by the insulating layer; and
   a source region and a contact region, each of which is disposed between the first and second field plate electrodes in the second direction, wherein the contact region extends in the second direction from the source region to the insulating layer adjacent to the first field plate electrode.

2. The semiconductor device of claim 1, wherein the source region extends from the contact region to a portion of the insulating layer that is adjacent to the second field plate electrode.

3. The semiconductor device of claim 1, wherein a third field plate electrode is disposed within a portion of the insulating layer that is between the contact region and the first field plate electrode in the second direction.

4. The semiconductor device of claim 3, wherein the third field plate electrode and the contact region extend inwardly of the drift layer in the first direction to a first terminal position and a second terminal position, respectively;
   a drain layer located on the drift layer on a side thereof opposed to the side thereof into which the field plate electrode inwardly extends; and
   a distance from the first terminal position of the third field plate electrode to the drain layer is greater than a distance from the second terminal position of the contact region to the drain layer.

5. The semiconductor device of claim 3, wherein the gate electrode is disposed between the source region and the second field plate electrode.

6. The semiconductor device of claim 5, wherein the gate electrode is spaced from the source region and the second field plate electrode by the insulating layer.

7. The semiconductor device of claim 1, wherein the gate electrode is provided as a first gate electrode portion and a second gate electrode portion, and the first and second gate electrode portions are located on either side, in the second direction, of the second field plate electrode; and
   a third field plate electrode is between the first field plate electrode and the contact region.

8. The semiconductor device of claim 1, wherein a source electrode contacts the source region and the contact region, and the source region and contact region are differently doped.

9. The semiconductor device of claim 8, wherein the source electrode is spaced from the gate electrode and the first and second field plate electrodes by an interlayer insulating layer.

10. The semiconductor device of claim 8, wherein the insulating layer extends partially between the source and a drain layer in the first direction.

11. The semiconductor device of claim 9, wherein the interlayer insulating layer partially extends in the second direction between the second field plate electrode and the source electrode.

12. A semiconductor device comprising:
    a first semiconductor layer of a first conductive type;
    a second semiconductor layer of a second conductive type formed on the first semiconductor layer;
    a first semiconductor region of the first conductive type formed on the second semiconductor layer;
    a second semiconductor region of the second conductive type that comes in contact with the first semiconductor region formed on the second semiconductor layer, with the second semiconductor region having a higher concentration of impurity elements than in the second semiconductor layer;
    a first electrode that comes in contact with the first semiconductor region, the second semiconductor layer and the first semiconductor layer through a first insulating layer;
    a second electrode that comes in contact with second semiconductor region through a second insulating layer;
    a third electrode connected to the first semiconductor region as well as the second semiconductor region; and
    a fourth electrode electrically connected to the first semiconductor layer.

13. The semiconductor device according to claim 12, further comprising:
    a pair of fifth electrodes in the first semiconductor region, the first electrode and the second electrode through a third insulating layer, wherein
    a first width of the first semiconductor region, which is in a horizontal direction between the pair of fifth electrodes, and a second width of the second semiconductor region in this horizontal direction are the same magnitude.

14. The semiconductor device according to claim 13, wherein a first length between a lower end of the second semiconductor region and a lower surface of the first semiconductor region is smaller than a second length between a lower end of the second electrode and the lower surface of the first semiconductor region.

15. The semiconductor device according to claim 12, wherein
the second electrode and a pair of fifth electrodes contact the third electrode.

16. A method of forming a power semiconductor device, comprising:
forming a drift layer;
forming a plurality of first field plate electrodes adjacent to and spaced from one another to extend inwardly of the drift layer;
forming secondary electrode structures on either side of at least two adjacent first field plate electrodes; and
on the portion of the drift layer between the at least two adjacent first field plate electrodes in the plurality of first field plate electrodes, forming a single contact region and a single source region, such that one of the secondary electrode structures is interposed between the single source region and a first one of the first field plate electrodes, and another of the secondary electrode structures is disposed between the single source region and a second one of the first field plate electrodes.

17. The method of forming a power semiconductor device according to claim 16, further including:
forming an insulating layer over the drift layer;
patterning the insulating layer to form an opening to expose only a portion of the single source region on the drift layer, the single source region being previously doped; and
doping the portion of the single source region differently than an unexposed portion of the single source region to form the single contact region.

18. The method of forming a power semiconductor device according to claim 17, further including:
increasing the size of the opening in the insulating layer to expose at least a second portion of the single source region in the enlarged opening after forming the single contact region.

19. The method of forming a power semiconductor device according to claim 17, wherein the secondary electrode structure disposed between the single source region and the first one of the first field plate electrode is a gate electrode.

20. The method of forming a power semiconductor device according to claim 17, wherein the single contact region is inwardly deeper in the drift layer than an adjacent one of the secondary electrode structures into the drift layer.

* * * * *